(12) United States Patent
Collet et al.

(10) Patent No.: US 8,439,261 B2
(45) Date of Patent: May 14, 2013

(54) METHOD FOR PRODUCING AN ELECTRONIC OBJECT COMPRISING A DATA TRANSFER STAGE AND THE OBTAINED OBJECT

(75) Inventors: Pierre-André Collet, Grenoble (FR); Thierry Karlisch, La Ciotat (FR); François Moutel, Saint Zacharie (FR)

(73) Assignee: Gemalto SA, Meudon (FR)

( * ) Notice: Subject to any disclaimer, the term of this patent is extended or adjusted under 35 U.S.C. 154(b) by 0 days.

(21) Appl. No.: 13/154,479

(22) Filed: Jun. 7, 2011

(65) Prior Publication Data

US 2011/0281466 A1  Nov. 17, 2011

Related U.S. Application Data

(62) Division of application No. 11/922,334, filed as application No. PCT/EP2006/063295 on Jun. 16, 2006, now Pat. No. 7,975,375.

(30) Foreign Application Priority Data

Jun. 20, 2005  (FR) ...................................... 05 51674

(51) Int. Cl.
*G06K 7/06* (2006.01)
(52) U.S. Cl.
USPC ............................ 235/441; 235/487; 235/492
(58) Field of Classification Search .................. 235/441, 235/487, 492
See application file for complete search history.

(56) References Cited

U.S. PATENT DOCUMENTS

| | | | |
|---|---|---|---|
| 4,449,775 A | 5/1984 | de Pommery et al. | |
| 5,061,842 A | 10/1991 | Payne | |
| 5,265,328 A | 11/1993 | Gorman | |
| 5,703,346 A | 12/1997 | Bricaud et al. | |
| 5,752,857 A | 5/1998 | Knights | |
| 5,971,280 A | 10/1999 | Hoolhorst | |
| 6,002,605 A | 12/1999 | Iwasaki et al. | |
| 6,006,987 A | 12/1999 | Hoolhorst | |
| 6,016,962 A | 1/2000 | Nakata et al. | |
| 6,049,461 A | 4/2000 | Haghiri et al. | |
| 6,134,114 A | 10/2000 | Ungermann et al. | |
| 6,137,710 A | 10/2000 | Iwasaki et al. | |
| 7,975,375 B2* | 7/2011 | Collet et al. | 29/825 |
| 2004/0259423 A1* | 12/2004 | Elbaz et al. | 439/660 |
| 2005/0034889 A1 | 2/2005 | Mongin et al. | |
| 2005/0059301 A1 | 3/2005 | Chou et al. | |

FOREIGN PATENT DOCUMENTS

NL    1 017 881 C2    10/2002

OTHER PUBLICATIONS

"High-Speed Opens and Shorts Substrate Tester", IBM Technical Disclosure Bulletin, IBM Corp. New York, US, vol. 33, No. 12, May 1, 1991, pp. 251-259.

\* cited by examiner

*Primary Examiner* — Karl D Frech
(74) *Attorney, Agent, or Firm* — Buchanan Ingersoll & Rooney PC

(57) ABSTRACT

A method for producing a portable electronic object having contact pads arranged on a plane with a thickness which differs from the thickness of a standard smartcard. The object is electrically connected to data transfer station connectors, by delivering a data transfer station having an electric probe connector and submitting the object to the data transfer station in such a way that the contact pads thereof are accessible to the electric probes in a direction perpendicular to the plane. Objects obtainable include UBS keys or PCMCIA cards or readers.

12 Claims, 3 Drawing Sheets

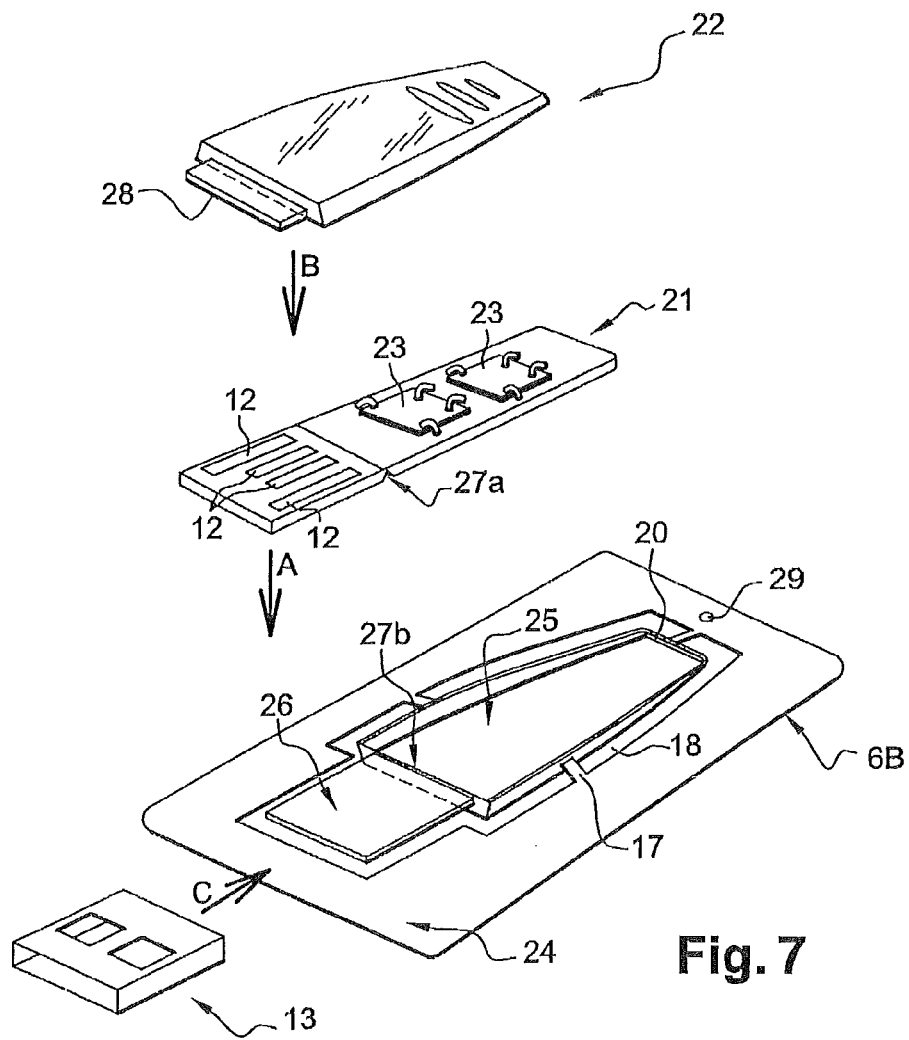
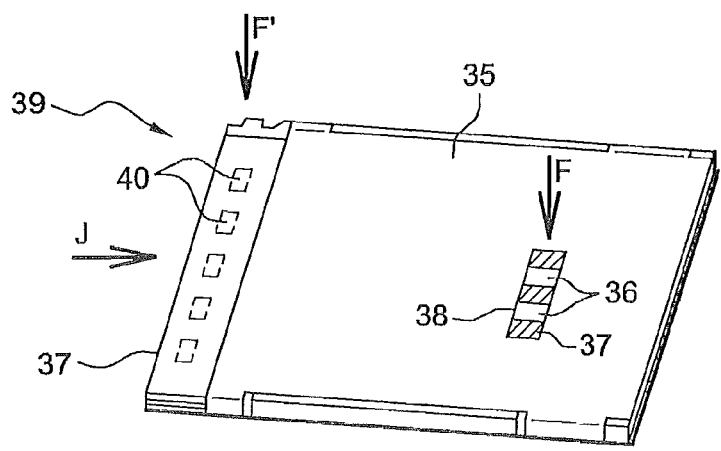

METHOD FOR PRODUCING AN ELECTRONIC OBJECT COMPRISING A DATA TRANSFER STAGE AND THE OBTAINED OBJECT

The invention relates to a method for producing a portable electronic object comprising contact pads and having a thickness which differs from that of a standard smart card, as well as to the obtained objects.

More specifically, the method comprises a step of electrical personalisation and/or initialisation of the object or electrical data transfer.

It has a preferable application in the production of personalised USB key drives, but can also be applied to other objects of various thicknesses having electrical contacts, such as memory cards, in particular such as MMC (multimedia cards), SD and PCMCIA-type cards or readers.

The USB keys are designed to be connected to a USB peripheral port (acronym for Universal Serial Bus) of a telecommunications device such as a personal computer. In general terms, a USB key comprises one portion inserted in the port of the device and another portion remaining outside the port for handling purposes. The key generally comprises a metal band surrounding the contacts.

The scope of use is as vast as that of smart cards and/or card readers (data securitisation, internet access, identification, e-commerce, on-line payment, cryptography, etc.)

Patent application PCT/FR02/03247 describes a method of producing a USB electronic key in which a module having contact pads compatible with the USB format is cut out from a smart card, and its thickness is then adjusted, at least at the level of the contact pads, to have a thickness that conforms to the USB standard. No electrical personalisation and/or initialisation is mentioned after the key has a thickness greater than that of a smart card.

The electrical personalisation and/or initialisation of USB keys is performed by manual insertion in a suitable connector. These operations consist of loading data which may be required for the operation of an object (data, program, encryption key) in the memory thereof by means of electrical contacts. In other cases, the operation can also consist of pre-loading multimedia data.

It can also consist of an electrical or electronic test operation of a circuit of the object, with or without electronic memory.

These operations are henceforth considered capable of being performed using a data-transfer station.

The invention aims to solve these disadvantages. It has the main aim of allowing automatic, high-speed data transfers (test, initialisation, electrical personalisation, loading, etc.) by electrical contact on a portable electronic object.

It also aims to facilitate the production operations of these objects.

For this purpose, the invention relates to a method of producing a portable electronic object, said method comprising the following steps:
  supplying an object comprising contact pads on one plane,
  supplying a data-transfer station having at least one connector with electric probes and having means for automatically gripping the object,
  automatic electric connection of the contact pads of the object with the connector of the data-transfer station,
  presenting the object to the data-transfer station so that the contact pads of the object can be accessed directly by the electric probes of the connector in a direction perpendicular to the plane.

The method is characterised in that the object has a thickness which differs from that of a standard smart card, and in that said means for automatically gripping the object are capable of adapting to an object thickness which differs from that of a standard smart card.

According to one embodiment, the object is provisionally attached to a support body by means of attachment means.

In this way, thanks to the invention, it is possible to personalise and produce electronic products that have thicknesses which differ entirely from that of a smart card using a card support with a surface area that is preferably substantially equal to that of a smart card in order to use current machines.

According to one specific embodiment:
  the method comprises a prior step in which the object is configured so that the electrical contacts open onto the surface through at least one window made in one face of the object;

In this way, it is even possible to use current smart-card machines to produce electronic objects not initially designed for this purpose, for example because they have an original thickness which is much greater than that of a smart card and/or connectors with different access forms.

According to other embodiments:
  the card body is in the ISO smart-card format;
  the object is chosen from among a USB key, an MMC card, an auxiliary storage card, any card comprising electrical contacts on the surface and having a thickness of more than 1 mm.

According to a preferred embodiment, the object is a USB key comprising a handling body and a connector extending as an extension of the body, said connector comprising a band surrounding linear contact pads.

It is characterised in that the windows in the band are dimensioned so that the electrical personalisation and/or initialisation can be performed through said openings of said band.

According to other embodiments:
  the band comprises at least one window for accessing the contacts, extending transversally across all the contacts;
  the attachment means comprise a pressure-sensitive adhesive fixed to the support card body;
  the attachment means comprise strips for linking with the card body having a predetermined break-off line;
  the object is fixed to the strips so as to be entirely positioned above the general plane of the card plane;
  an initial part of the object is attached to the card body and a production operation is performed while such part remains attached to the card body, said operation being chosen from among an operation of assembling complementary parts of the object with the initial part, graphic printing, packaging;
  the initial part of the object is produced at the same time as the card body by injection moulding and the complementary parts are assembled, the initial part being detachable from the card body;
  the initial part can be detached from the card body by breaking a predetermined break-off line around the object;
  the initial part is chosen from among a bottom shell, a top shell, an integrated-circuit support body and/or an integrated-circuit module.

The invention also relates to the product resulting from the above method.

In particular, it relates to a portable object with electronic memory comprising contact pads, said object being attached with the help of provisional attachment means to a support card and comprising contact pads which can be accessed in a direction perpendicular to the plane of the card body.

The object is characterised in that it has a thickness that is greater or smaller than that of the support card.

According to one embodiment, the object is configured to ensure that all the contacts open onto the surface by means of at least one window made in one face of the object. At least the contact pads required for a data transfer must be arranged in this way.

According to a specific embodiment, the invention relates to a portable electronic object having at least one face and contact pads, tracks or electrical connectors arranged under this face, said object comprising a so-called main opening allowing the contact pads or main connectors to be accessed through this opening in a direction (J), characterised in that it comprises at least one window made in said face so as to make the contact pads, tracks or main electrical connectors used for electric transfer accessible through the window in a direction other than the direction (J).

Other special features and advantages of the invention will become apparent from reading the description made as a strictly non-limiting example in relation to the appended figures, in which.

Figure 4:
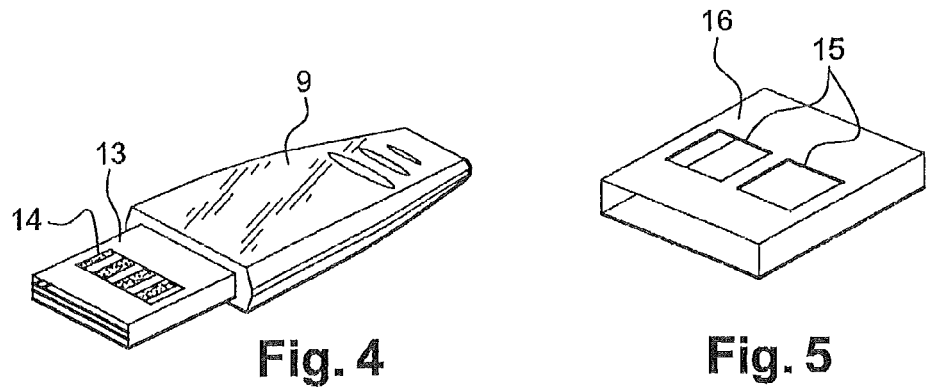
Figure 5:
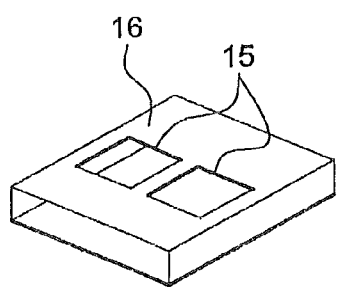
Figure 4A:
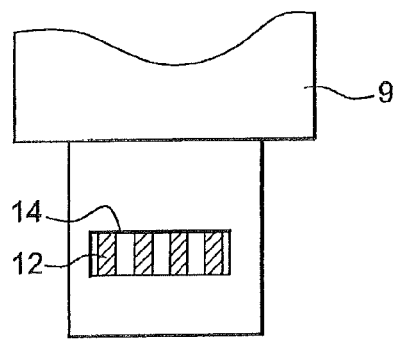
Figure 5A:
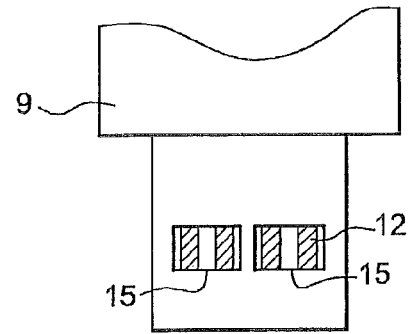
Figure 6:
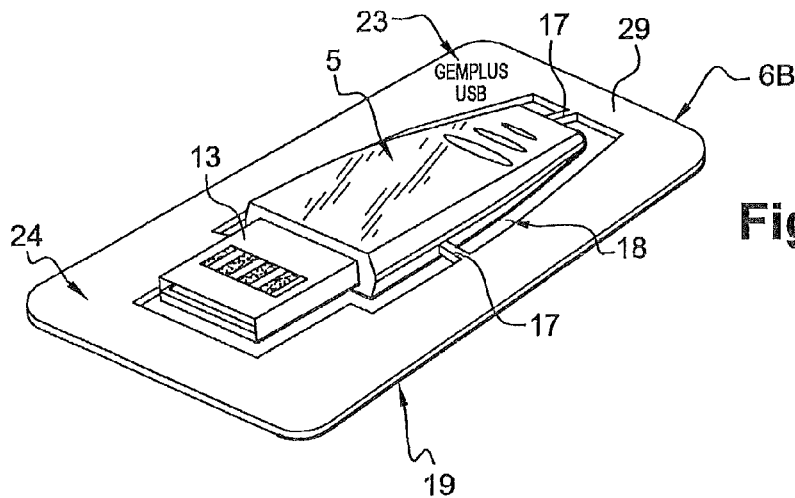
Figure 8:
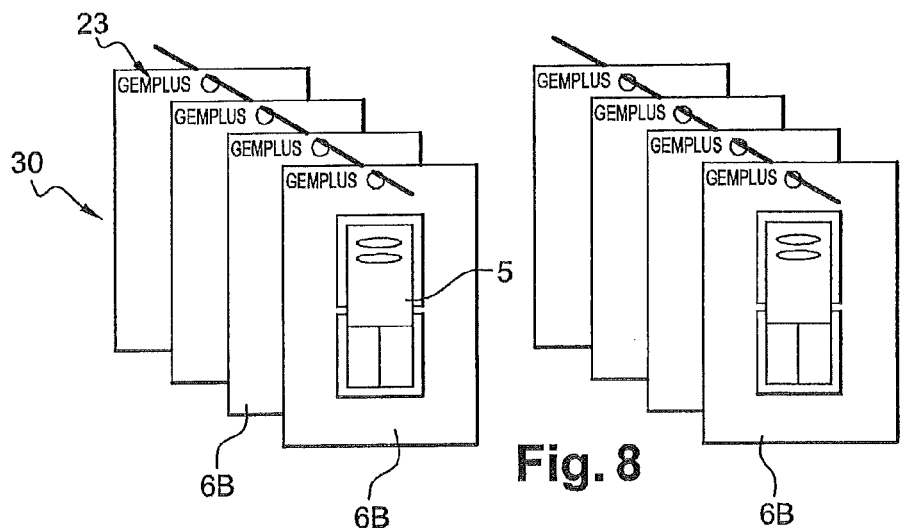

FIGS. 4, 4*a* respectively show a front view of a band and a partial top view of a USB key showing a metal band according to a first embodiment of the invention;

FIGS. 5, 5*a* respectively show a front view and a partial top view of a USB key showing a metal band according to a second embodiment of the invention;

FIG. 6 shows a key obtained by the assembly method of FIG. 7;

FIG. 7 shows an exploded perspective view of the components of a key according to the invention in the process of assembly according to a preferred embodiment;

FIG. 8 shows a display unit for keys obtained according to the invention;

FIG. 9 shows a PCMCIA-type object configured according to one embodiment of the invention.

The production method according to the invention relates to portable objects with electronic memory which comprise contact pads and which have a thickness which differs from that of a standard smart card. In particular according to ISO 7816, this thickness is equal to around 0.76 mm.

Preferably, the thickness of these objects is markedly greater than 0.76 mm, for example 1 mm and, in particular, around 3-7 mm for a USB key; however, the invention does not exclude objects that are much thinner than 0.76 mm, for example thinner than 0.4 mm, as long as there is a considerable difference, for example more than 0.5 mm with the thickness of a standard smart-card body, which is 0.76 mm.

It excludes modules (dielectric associated with contact pads connected to a resin-coated chip) designed to be permanently inserted in a card body cavity. In fact, modules to be inserted particularly using a permanent adhesive are not electronic entities as such when used independently from the card body.

The object can be chosen from among a USB key, an MMC card, an auxiliary storage card, any card comprising electrical contacts on the surface and having a thickness as above.

It is known to personalise objects with electronic memory, such as smart cards with mini-SIM chips which are detached from the card body once electrically personalised, but problems arise with objects that have different thicknesses and are furthermore generally produced according to various methods other than those used to obtain smart cards.

According to the invention, the method comprises a step of electrical personalisation and/or initialisation of the object and/or data transfer.

Figure 1:
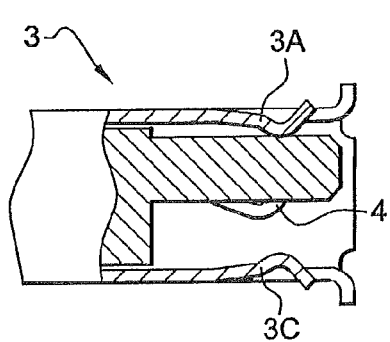
FIG. 1 shows a connector of a terminal designed to receive a USB key.
Figure 2:
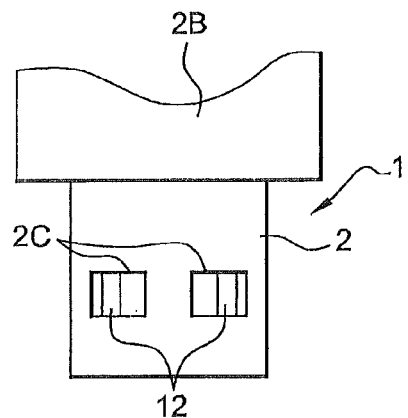
FIG. 2 shows a partial top view of a USB key showing a metal band.

In reference to FIGS. 1 and 2, this step consists in the prior art, in particular for a USB key 1, of connecting the key to a connector 3 of a personalisation terminal/station. This operation is performed manually and then all kinds of data, programs, secret keys or others can be inserted in the object via this interface by the connectors 4.

USB keys of the prior art comprise a band 2 surrounding the contact pads 12 as an extension of the handling body 2B.

The band comprises windows 2C in order to allow a first original function, which is to engage the supporting leaf springs 3A, 3C of the connector in FIG. 1.

According to one characteristic of implementation of the invention, the object is initially attached to a support body 6 using attachment means and then presented to a personalisation and/or initialisation 10 or transfer station which is completely different from the prior art as indicated below.

Figure 3:
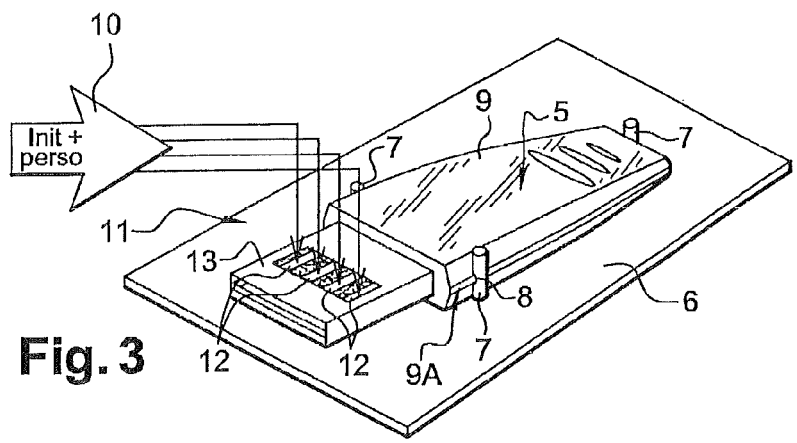
FIG. 3 shows a front view of the electrical personalisation and/or initialisation step diagrammatically depicting the electric probes.

In the example, in FIG. 3, the object in this case is a USB key 5, and the support body 6 is advantageously in the format of a smart card, made from PVC plastic.

Other formats or thicknesses may be used, and the body can be made from another plastic material, but may also be made from a different material, for example cardboard, paper, metal or others.

According to another characteristic, the object is attached using provisional attachment means (allowing the object to be detached) so as to make its contact pads accessible to a connector with rectilinear probes in a direction perpendicular to the plane of the card body.

In the example, the key is attached with the help of three studs 7 solidly attached to the card. They comprise notches 8 cooperating with the corners of the handling body 9 to hold the key on the support body 6.

The studs advantageously slightly exceed the total thickness of the key in order to provide a base plane for another card to be stacked, thus allowing stable and regular stacking despite the bulging shapes of the keys.

As an alternative, the attachment means 7, 8 can comprise a pressure-sensitive adhesive (not shown) fixed to the support card body. They can also comprise strips for linking 17 to the card body 6B and have a predetermined break-off line or pre-cut 18 surrounding the key as explained in a preferred example below.

The attachment means can cooperate with shapes of the object for supporting it, for example an angular contour 9A on the handling body.

According to another characteristic of implementation, the personalisation and/or initialisation 10 is performed by means of rectilinear electric probes 11, represented by four arrows in the figure. These probes have a geometrical configuration that is adapted to the configuration of the electrical contact pads of the USB key and simply need to rest perpendicularly against the contact pads 12.

The inventors have realised that automatic electrical personalisation stations 10 comprise gripping means, generally used to grip an ISO format smart card and move it to different work stations, but which have a design that offers considerable tolerance as regards the thickness of the card. This tolerance can be of several millimeters, currently up to 15 mm.

This station can therefore adapt to objects with different thicknesses and shapes thanks to these gripping means, possibly with adjustable or variable gripping openings.

The card gripper in fact has a gripping and support mechanism comparable with a clothes peg, with a considerable opening. Other mechanisms can be used, such as a system with a jack pressing on the object.

The personalisation installation comprises means for moving and positioning the key with its support in the gripping means with a claw, which grip and support the assembly for handling between operation stations.

Advantageously, the installation can comprise several gripping means and an electrical transfer station for each gripping means, for example mounted forming a cylinder. In this way, the electrical transfer is carried out in concurrent operation time during the movement of the object within the production chain.

This implementation is relatively straightforward for objects that already have contact surface opening onto the surface. However, in the case of a USB key with a metal band, the contacts are not always easily accessible.

This is why the method also comprises an alternative embodiment in which a prior step consists of configuring the object so that the electrical contacts open onto the surface through at least one window made in one face of the object.

In FIG. 4, the face in question is a metal band 13 surrounding linear contact pads 12 of the connector, and which extends as an extension of the key handling body 9.

Prior to complete assembly of the key, a band specific to the embodiment of the invention is created, by arranging and dimensioning at least one opening or window 14 in the band 13 in order to allow electrical personalisation and/or initialisation through said openings.

In one example, FIGS. 4 and 4a, a single window for accessing the contacts extends transversally across all the contacts. Its dimensions are, for example, 9.7×2 mm. In another example, FIGS. 5, 5a, two windows 15 with respective dimensions equal to 3.5×2 mm are arranged in the band 16 allowing free access to the contact pads.

The windows can be designed to also allow their first original function, which is to engage the supporting leaf springs 3A, 3C of a connector such as that shown in FIG. 1.

In FIG. 6, the USB key 5 is fixed to strips 17 which are in turn connected to the support body 6B so as to be entirely positioned above the general plane of the card plane or at least above a bottom plane 19 of the support body 6B.

This allows the cards to be stacked with mutual self centring.

In reference to FIG. 7, a preferred embodiment of the invention will now be described for obtaining the key depicted in FIG. 6.

According to a first step of this embodiment, an initial part 20 of the object 5 is fixed to a card body 6B and a production operation mentioned below is performed while the object remains attached to the card body.

These operations can include an operation of assembling complementary parts 21, 22 of the object with the initial part, graphic printing 23, packaging. For graphic printing, it is possible in particular to perform ink-jet printing.

In this way, rather than attaching the finished object directly to the card, in particular using the previously indicated attachment means 7, one element 20 is attached to the object and then completed with the remaining elements 21, 22, 13.

In the example, a bottom shell 20 of the key is attached by strips 17 to a card body.

According to one advantageous step, the initial part of the object is produced at the same time as the card body by injection moulding and the complementary parts are assembled, the initial part being detachable from the card body. Where applicable, the pre-cut can be made mechanically, for example by punching.

In the example, the initial part is the bottom shell of the key, but it is foreseeable to choose another part such as the top shell 22 or a support body of an integrated circuit 23 or of an integrated-circuit module.

The initial part can preferably be detached from the card body by breaking a predetermined break-off line around the object.

In the example, this line is formed by a recess surrounding the shell and by thinner areas of the strips at the edges of the bottom shell. The strips support the shell at a level situated completely above the general top plane 24 of the card.

The assembly of the key is depicted by the steps of assembly in the order of the arrows (A, B, C).

In particular, a bottom shell is assembled comprising two essential parts: a concave part 20 providing a space 25 for receiving a part 21 of a support and a flat area 26 or plate extending the concave part.

After assembly, the chip support 21 rests entirely against the bottom shell and the flat area extends entirely under a front part of the support comprising the contact pads 12.

The flat area has the function of completing the thickness of the support at the level of the contact pads so as to have an overall thickness at this level that conforms to the USB standard.

The chip support has a thickness of around 0.76 mm while the USB thickness to be reached is around 1.95 mm.

The support can comprise, on its bottom face, a transversal groove 27a adjacent to the module. It has the function of becoming accommodated on a matching rib 27b of the case located at the junction of the two sub-parts 25/26 of the bottom shell and locking the support 21 in position.

Other attachment means, detachable or not, in particular by gluing, clipping or sliding known to those skilled in the trade for holding the support in place in the shell can complete the shell and/or the support.

The key can thus be used, where applicable, with a metal band 13 surrounding the whole of the flat area and the contact pads of the support 21.

A top half-shell 22 is placed above the support so as to cover a part of the support, in this case the rear part of the support, outside the contact pads, and to be fitted onto the bottom shell, sandwiching the chip support 21.

The top half-shell can comprise a shoulder 28 with the same width as the metal band, and which extends towards the front of the shell. The shoulder can extend, for example, to the limit of the contact pads after assembly on the support. The metal band or ring 13 can then surround/circle the entire flat area, shoulder and contacts in order to provide additional support for the two top and bottom half-shells.

The top half-shell can be inserted, using any suitable attachment means, on the bottom half-shell. The shells can be assembled by snap-fitting, gluing, ultrasonic sealing, screwing, etc.

Finally, to complete the key, the front part of the shell can comprise means for attaching a protective cap.

The card body can comprise an orifice 29 (FIG. 6) for hanging the keys or objects resulting from the method.

FIG. 8 shows display units 30 comprising the object 5 of the invention without any other packaging than that provided by the support card. Where applicable, an additional wrapping, such as a transparent plastic film, is affixed on either side of the key.

Thanks to the invention, the same support 6B is used at least for electrical personalisation, data transfer and for packaging purposes, while neither the initial thickness of the card support nor its origin allow it to be compared with an object produced otherwise and having a different thickness.

In FIG. 9, a portable electronic object comprises at least one face 35 and electrical tracks 36 arranged under this face. These electrical tracks make is possible to test, initialise, personalise and charge the electronic circuit of the object.

The tracks can be contact pads or electric connectors. In the example, these are electrical tracks arranged on a printed circuit 37 of the object. In fact, the opening is arranged above the passage of the conductors used when performing an electrical transfer.

According to one embodiment, the object comprises a window made in the face so as to provide access to the tracks through said window in a first direction F.

The object can comprise a second so-called main window designed to provide access to the contact pads or connectors 37 through the second window in a direction J which differs from the first direction F. The aforementioned electrical data or signal transfers are generally carried out via these connectors 37.

In the example, the object depicts a PCMCIA card 39 seen from below. Since its format is substantially equal to that of a smart card (with the exception of its thickness), it does not require a support card in order to be personalised, tested, etc.

The object can also act as a smart-card reader by comprising a smart-card connector placed, for example, on the face opposite the face 35.

According to another embodiment, the PCMCIA card can comprise openings or windows 40 arranged on one face near the main connector 37.

In this case, the main connectors are accessible in a direction F' which differs from and is more practical than the direction J for automated personalisation.

The invention claimed is:

1. Portable electronic object attached to a support card body by temporary attachment means on said support card body, said object comprising electrical contacts configured to connect with a communication device in an insertion direction, said object having a thickness which differs from that of a standard smart card, wherein the object has a maximum thickness in a direction perpendicular to a major plane of the support card body that is greater or smaller than that of the support card body.

2. Object according to claim 1, wherein it is configured to ensure that all the electrical contacts open onto a surface by means of at least one window made in one face of the object.

3. Object according to claim 1, wherein the support card body is in ISO smart-card format.

4. Object according to claim 1, wherein it constitutes a USB key, an MMC card, an auxiliary storage card, or any card comprising electrical contacts on a surface and having a thickness of more than 1 mm.

5. Object according to claim 1, wherein the object is a USB key comprising a handling body and a connector extending as an extension of the handling body, said connector comprising a band surrounding the electrical contacts and comprising at least one window on one face of the band, wherein:
the window is dimensioned so as to be located facing all the contact pads.

6. Object according to claim 5, wherein the band comprises at least one window for accessing the electrical contacts, extending transversally across all the electrical contacts.

7. Object according to claim 1, wherein the object is attached with the help of a pressure-sensitive adhesive fixed to the support card body.

8. Object according to claim 1, wherein the object is connected to the support card body by means of strips having a predetermined break-off line.

9. Object according to claim 8, wherein the object is attached to the strips so as to be entirely positioned above a general top plane of the support card body.

10. Portable electronic object having at least one face and electrical contacts arranged under the at least one face, said object comprising an opening so as to make accessible or connect the electrical contacts through the opening in a direction (J),
further comprising at least one window made in said at least one face so as to make accessible or connect the electrical through the window and in a direction other than the direction (J).

11. Portable electronic object according to claim 10, wherein said object comprises a PCMCIA card.

12. Object according to claim 10, constituting a USB key comprising a handling body and a connector extending as an extension of the handling body, said connector having a band surrounding the electrical connectors, wherein said window is located in the band facing the electrical connectors.

* * * * *

UNITED STATES PATENT AND TRADEMARK OFFICE
CERTIFICATE OF CORRECTION

PATENT NO. : 8,439,261 B2
APPLICATION NO. : 13/154479
DATED : May 14, 2013
INVENTOR(S) : Pierre-André Collet et al.

It is certified that error appears in the above-identified patent and that said Letters Patent is hereby corrected as shown below:

In the Specification

In column 6, line 14 change "formed by a recess surrounding" to -- formed by a recess 18 surrounding --

Signed and Sealed this
Seventeenth Day of September, 2013

Teresa Stanek Rea
*Deputy Director of the United States Patent and Trademark Office*